(12) United States Patent
Lee et al.

(10) Patent No.: US 6,885,605 B2
(45) Date of Patent: Apr. 26, 2005

(54) POWER-UP SIGNAL GENERATOR FOR SEMICONDUCTOR MEMORY DEVICES

(75) Inventors: Kang Seol Lee, Seoul (KR); Jae Jin Lee, Kyoungki-do (KR); Kee Teok Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 119 days.

(21) Appl. No.: 10/255,999

(22) Filed: Sep. 26, 2002

(65) Prior Publication Data

US 2003/0117875 A1 Jun. 26, 2003

(30) Foreign Application Priority Data

Dec. 21, 2001 (KR) ........................................ 2001-82255

(51) Int. Cl.[7] ........................ G11C 5/14; G11C 11/4193
(52) U.S. Cl. ..................................... 365/226; 365/227
(58) Field of Search ............................... 365/226, 227, 365/228, 229

(56) References Cited

U.S. PATENT DOCUMENTS

| | | | |
|---|---|---|---|
| 4,801,820 A | 1/1989 | Nootbaar | 307/296 R |
| 5,822,246 A | 10/1998 | Taub et al. | |
| 5,844,853 A | 12/1998 | Kitsukawa et al. | 365/226 |
| 5,877,975 A | 3/1999 | Jigour et al. | 365/52 |
| 5,880,596 A | 3/1999 | White | 326/38 |
| 5,880,622 A * | 3/1999 | Evertt et al. | 327/535 |
| 5,894,446 A * | 4/1999 | Itou | 365/222 |
| 5,898,635 A | 4/1999 | Raad et al. | |
| 5,982,704 A | 11/1999 | Kim | 365/230.08 |
| 6,028,474 A | 2/2000 | Ito | 327/544 |
| 6,081,466 A | 6/2000 | McClure et al. | 365/201 |
| 6,201,751 B1 | 3/2001 | Thomann | |
| RE37,195 E | 5/2001 | Kean | 326/39 |
| 6,510,096 B1 * | 1/2003 | Choi et al. | 365/226 |

FOREIGN PATENT DOCUMENTS

| | | |
|---|---|---|
| JP | 62009585 | 1/1987 |
| JP | 10107610 | 2/2000 |

OTHER PUBLICATIONS

Communication from German Patent and Trademark Office dated Mar. 30, 2004 with translation (7 pages).

* cited by examiner

*Primary Examiner*—Michael S. Lebentriti
*Assistant Examiner*—J. H. Hur
(74) *Attorney, Agent, or Firm*—Marshall, Gerstein & Borun LLP

(57) ABSTRACT

A power-up signal generator uses a deep power down power-up signal, which should be in a standby state in a deep power down entry, for an initialization of other semiconductor elements in a DRAM device that operates after an internal power supply voltage is generated. The generator also uses the power-up signal, which is disabled in the deep power down entry and enabled in a deep power down exit by the internal power supply voltage. The generator may include a power-up detector for generating a power-up detection signal, a deep power down power-up signal generator for generating a deep power down power-up signal, a power-up signal generator for generating a power-up signal and a power-up controller for determining whether or not to enable the power-up signal in the deep power down entry.

11 Claims, 12 Drawing Sheets

POWER-UP SIGNAL GENERATOR FOR SEMICONDUCTOR MEMORY DEVICES

BACKGROUND

1. Technical Field

Power-up signal generators for semiconductor memory devices are disclosed and, more particularly, to a power-up signal generator is disclosed for generating a power-up signal that is disabled during a deep power down entry and enabled by an internal power supply voltage during a deep power down exit.

2. Background of the Related Art

A deep power down entry designates a state in which all internal power supply voltages used inside a dynamic random access memory (DRAM) device are turned off to reduce a standby current drain when the DRAM device is not used for a period time. A power-up signal is a signal indicating that a DRAM device is able to operate normally. When the power-up signal is enabled at a high level, the DRAM device operates normally.

FIGS. 1 and 2 are circuit diagrams of power-up signal generators known in the prior art. The power-up signal generator includes a voltage divider 11 for dividing an external power supply voltage Vext, a pull-up unit 12 for pulling-up a divided voltage A, a driving unit 16 for receiving the divided voltage A to generate a power-up detection signal DET for determining the time that a power-up signal PWRUP is enabled, and a driving unit 15 for receiving the power-up detection signal DET to generate the power-up signal PWRUP. The driving unit 16 includes a pull-up unit 14 for pulling-up the power-up detection signal DET and a pull-down unit 13 for pulling-down the power-up detection signal DET.

The voltage divider 11 includes resistors R1 and R2 connected in series between the external power supply voltage Vext and a ground voltage Vss. The pull-up unit 12 includes a NMOS transistor N1 that is connected between the external power supply voltage Vext and a node SN1 and the divided voltage A is applied to its gate. The pull-down unit 13 includes an NMOS transistor N2 connected between an output node SN2 and the ground voltage Vss. The divided voltage A is applied to a gate of the NMOS transistor N2. The pull-up unit 14 includes a resistor R3 connected between the external power supply voltage Vext and the output node SN2. The driving unit 15 includes an inverter IV1 connected between the external power supply voltage Vext and the ground voltage Vss. The inverter IV1 inverts the power-up detection signal DET to output the power-up signal PWRUP.

The construction of the power-up signal generator of FIG. 2 is the same as that of the power-up signal generator of FIG. 1, except that a PMOS transistor P1 is used in the pull-up unit 14 instead of the resistor R3. Accordingly, a detailed description of FIG. 2 is omitted.

In the prior power-up signal generator, the power-up signal PWRUP is disabled at a low level until an internal power supply voltage, which is generated from the external power supply voltage Vext, reaches a stable level. The power-up signal PWRUP is enabled at a high level when the current flowing through the resistor R3 (FIG. 3) or the PMOS transistor P1 (FIG. 2) is larger than the current flowing through the NMOS transistor N2.

The power-up signal PWRUP is always enabled in a deep power down entry, as well as in a deep power down exit. The power-up signal PWRUP is always enabled because some semiconductor elements such as a clock buffer, or a mode register set, etc., should be in an operation state during the deep power down exit.

However, if the power-up signal PWRUP is enabled at a high level in a deep power down entry, the DRAM device operates in the state in which the internal power supply voltage is not generated. Accordingly, the semiconductor elements that operate by the internal power supply voltage will malfunction because the internal power supply voltage Vint is not provided thereto.

SUMMARY

To prevent a malfunction in the deep power down entry, use of a deep power down power-up signal which is always enabled for semiconductor elements and which maintains at a stand by mode in the deep power down entry and use of a power up signal which is disabled in the deep power down entry and which is enabled in a deep power down exit for semiconductor elements which operates after an internal power supply voltage is generated.

The disclosed apparatus may include a power-up detector for generating a power-up detection signal by means of an external power supply voltage; deep power down power-up signal generator for generating a deep power down power-up signal in response to the power-up detection signal, a power-up signal generator for generating a power-up signal in response to the power-up detection signal and power-up controller for determining whether or not enable the power-up signal in a deep power down entry.

In another aspect, the disclosed apparatus may include a power-up detector for generating a power-up detection signal by means of an external power supply voltage, a deep power down power-up signal generator for receiving the power-up detection signal to generate a deep power down power-up signal and a power-up controller for receiving the power-up detection signal and a deep power down mode signal to generate a power-up control signal. The disclosed apparatus may also include a power-up signal generator for generating a power-up signal that is enabled or disabled in response to the power-up control signal.

In another aspect, the disclosed apparatus may include a deep power down power-up signal generator for generating a deep power down power-up detection signal by means of an external power supply voltage, power-up signal generator for generating a power-up signal by the means of an internal power supply voltage and power-up controller for determining whether or not enable the power-up signal in a deep power down entry.

DETAILED DESCRIPTION

Figure 1:
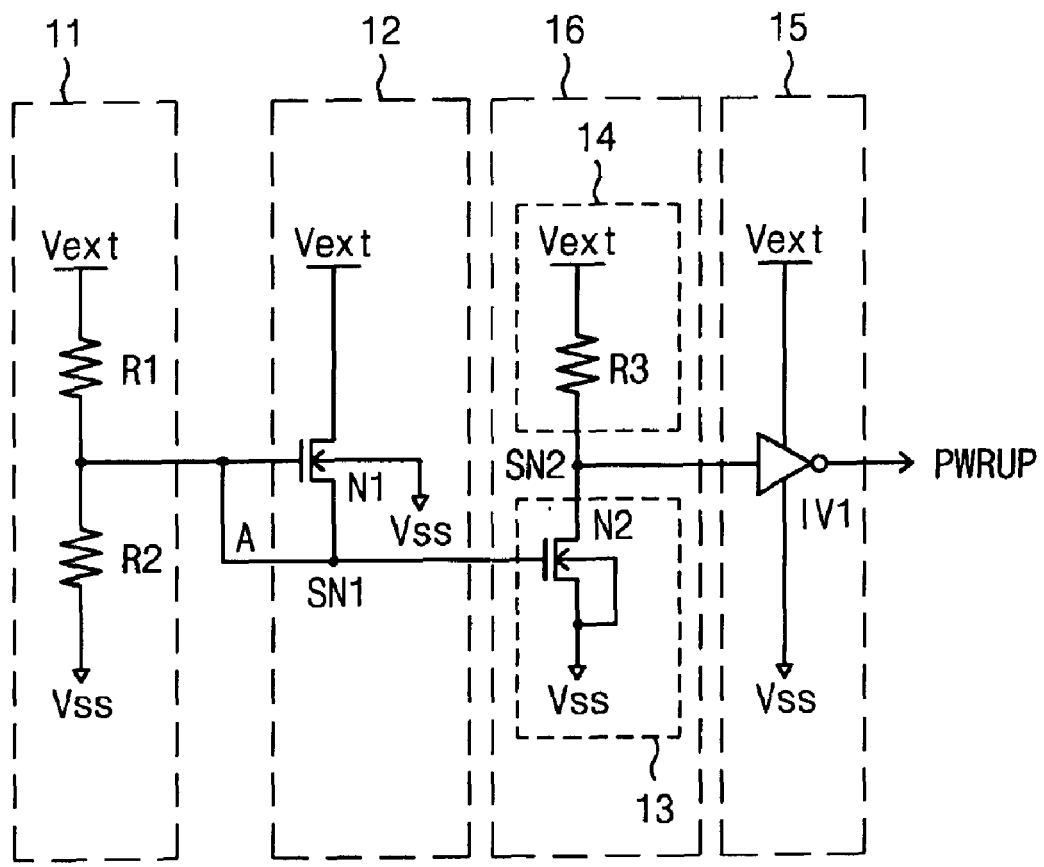
FIGS. 1 and 2 are circuit diagrams of power-up signal generators according to the prior art.
Figure 2:
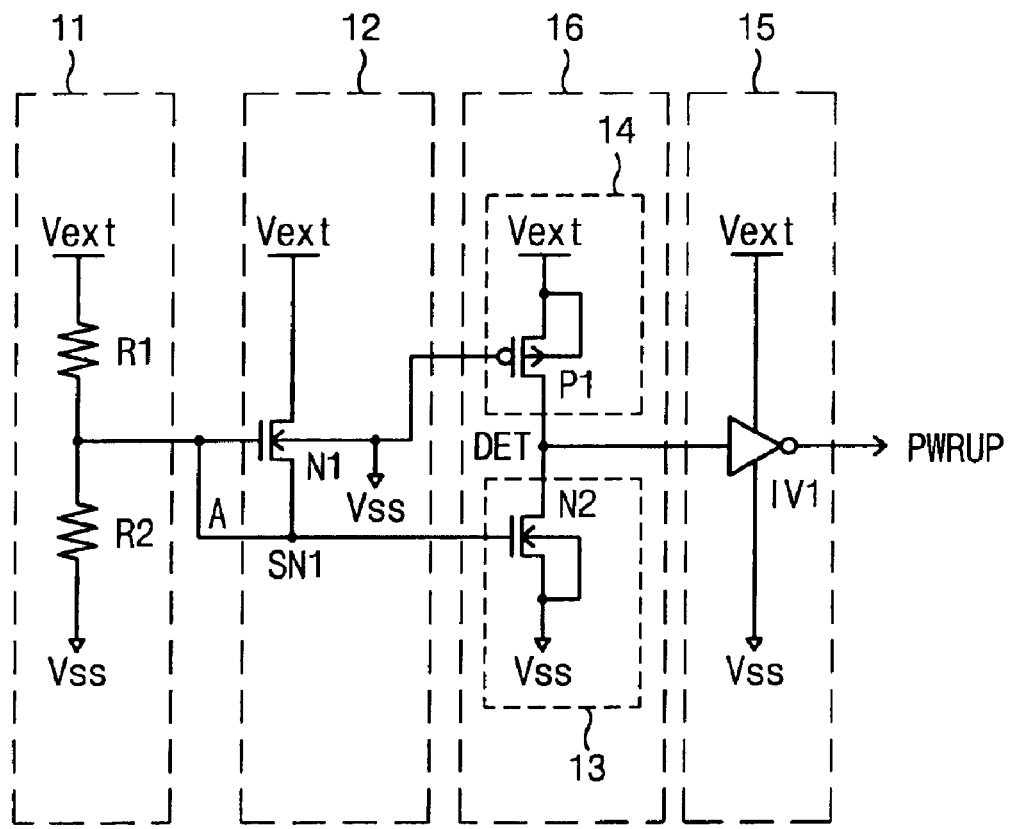
Figure 3:
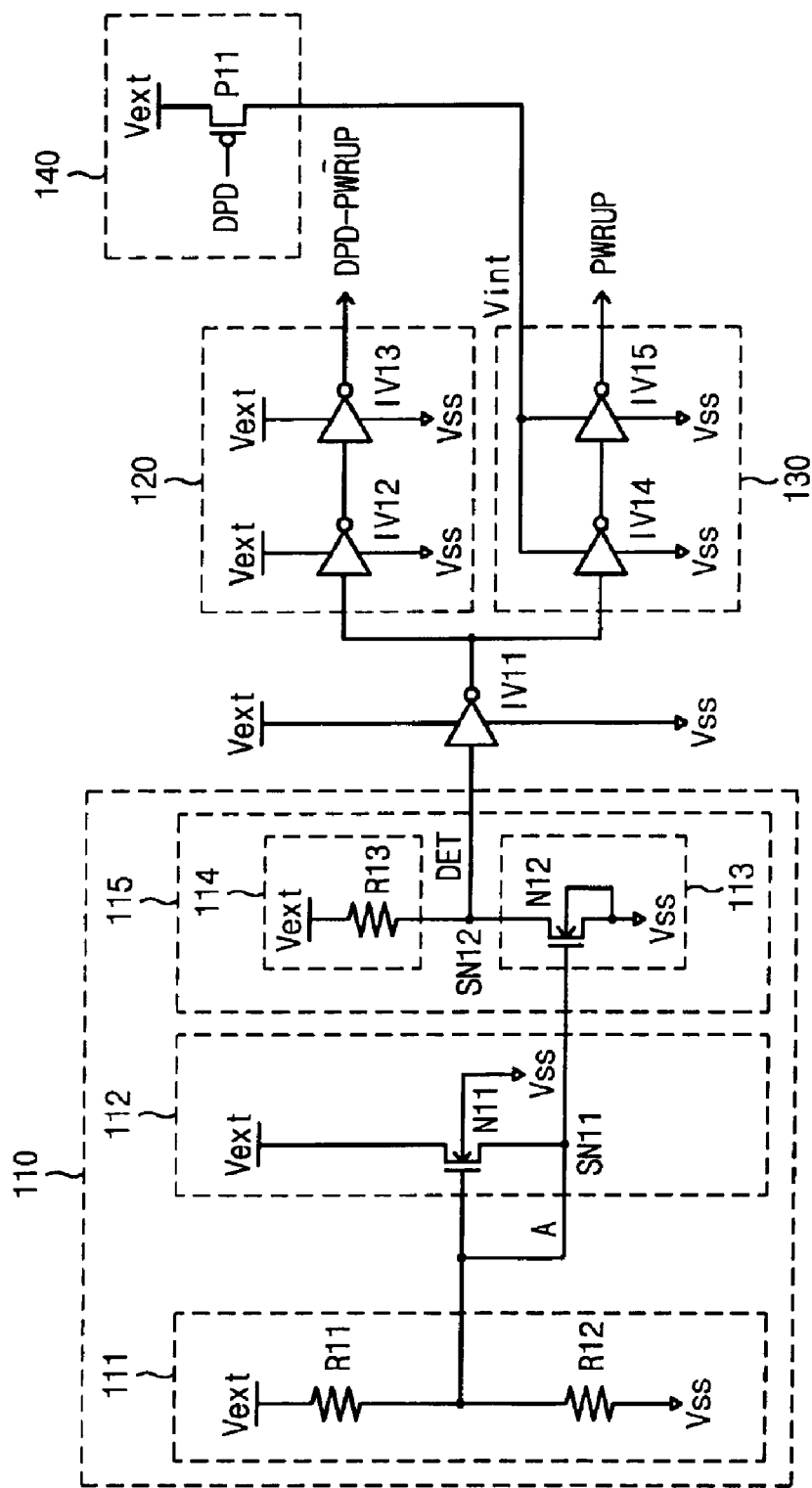
FIGS. 3 and 4 are circuit diagrams of a first type of power-up signal generators.
Figure 4:
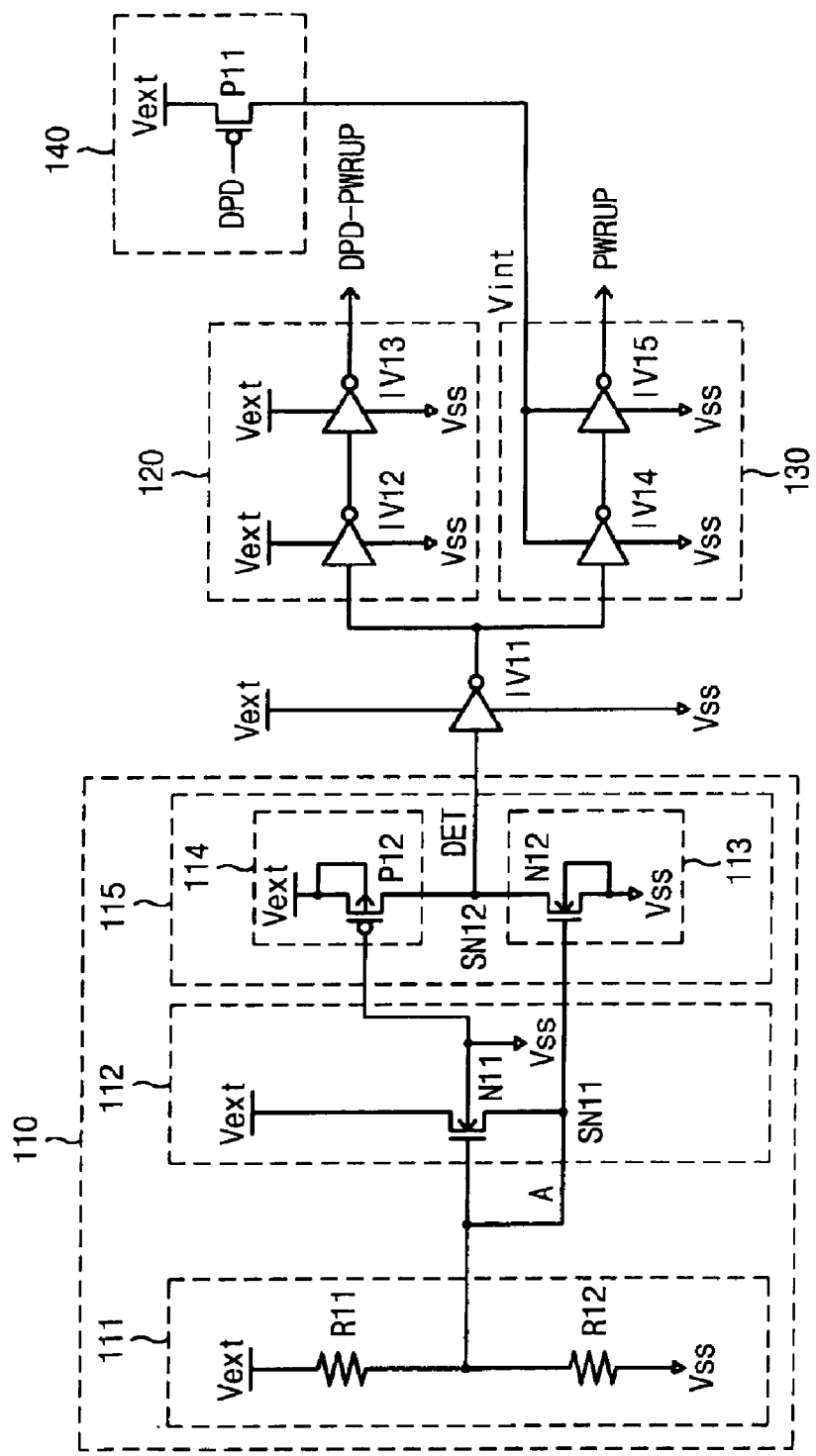

Turning now to FIGS. 3 and 4, the first type of power-up signal generators include a power-up detector 110, a deep power down power-up signal generator 120, a power-up signal generator 130 and a power-up controller 140.

The power-up detector 110 includes a voltage divider 111 for dividing an external power supply voltage Vext, a pull-up unit 112 for pulling-up a divided voltage A and a driving unit 115 for receiving the divided voltage A to generate a power-up detection signal DET for determining an enable time of a deep power down power-up signal DPD-PWRUP and a power-up signal PWRUP. The driving unit 115 includes a pull-up unit 114 for pulling-up the power-up detection signal DET and a pull-down unit 113 for pulling-down the power-up detection signal DET.

The voltage divider 111 includes resistors R11 and R12 connected in series between the external power supply voltage Vext and a ground voltage Vss. The pull-up unit 112 includes an NMOS transistor N11 connected between the external power supply voltage Vext and a node SN11 and has the divided voltage A applied to its gate. The pull-down unit 113 includes a NMOS transistor N12 connected between an output node SN12 and the ground voltage Vss. The divided voltage A is applied to the gate of N12. The pull-up unit 114 includes a resistor R13 connected between the external power supply voltage Vext and the output node SN12.

The power-up detector 110 outputs the power-up detection signal DET according to a current ratio of the resistor R13 and the NMOS transistor N12. The power-up detection signal DET determines the time that the deep power down power-up signal DPD-PWRUP and the power-up signal PWRUP are enabled. That is, when the current flowing through the resistor R13 (or the PMOS transistor P12 of FIG. 4) is larger than the current flowing through the NMOS transistor N12, the power-up detector 110 outputs the power-up detection signal DET of a low level to enable the deep power down power-up signal DPD-PWRUP and the power-up signal PWRUP at a high level.

The inverter IV11 inverts the power-up detection signal DET. The deep power down power-up signal generator 120 includes inverters IV12 and IV13 connected between the external power supply voltage Vext and the ground voltage Vss. The inverters IV12 and IV13 invert an output signal of an inverter IV11 to generate the deep power down power-up signal DPD-PWRUP.

The deep power down power-up signal generator 120 generates the deep power down power-up signal DPD-PWRUP, which is always enabled in the deep power down entry as well as the deep power down exit.

The power-up signal generator 130 includes inverters IV14 and IV15 connected between the internal power supply voltage Vint and the ground voltage Vss. The inverters IV14 and IV15 invert the output signal of the inverter IV11 to generate the power-up signal PWRUP. The power-up signal generator 130 generates the power-up signal PWRUP, which is disabled at a low level in deep power down entry and enabled at a high level by the internal power supply voltage Vint in the deep power down exit.

The power-up controller 140 includes a PMOS transistor P11 with its source connected to the external power supply voltage Vext. A deep power down mode signal DPD is applied to its gate. In the deep power down entry, the deep power down mode signal DPD is at a high level and, therefore, the power-up controller 140 is not enabled and does not provide the external power supply voltage Vext to the power-up signal generator 130. In the deep power down exit, the deep power down mode signal DPD is at a low level and, therefore, the power-up controller 140 is enabled to provide the internal power supply voltage Vint from the external power supply voltage Vext. The internal power supply voltage Vint is, in turn, supplied to the power-up signal generator 130.

The construction of the power-up signal generator of FIG. 4 is substantially the same as that of the power-up signal generator in FIG. 3 except that a PMOS transistor P12 is used in the power-up detector 110 rather than the resistor R13 of FIG. 3. Accordingly, a detailed description of FIG. 4 is omitted.

Hereinafter, operation of the power-up signal generator of FIGS. 3 and 4 is described in brief. First, the deep power down power-up signal DPD-PWRUP is used for a clock enable buffer, or a mode register set, etc., which should be in a standby state in the deep power down entry. The power-up signal PWRUP is used for an initialization of other semiconductor elements in a DRAM device by means of the internal power supply voltage.

When the current flowing through the resistor R13 (FIG. 3) or the PMOS transistor P12 (FIG. 4) is larger than the current flowing through the NMOS transistor N12, the power-up detection signal DET transitions to a low level. When the power-up detection signal DET transitions to a low state, the deep power down power-up signal DPD-PWRUP and a power-up signal PWRUP become enabled at high levels.

At this time, the deep power down power-up signal DPD-PWRUP is always enabled at a high level in the deep power down entry and the deep power down exit. On the other hand, the power-up signal PWRUP is disabled at a low level in the deep power down entry and is enabled at a high state by the internal power supply voltage Vint from the PMOS transistor P11 in the deep power down exit.

In more detail, the deep power down mode signal DPD is at a high level in the deep power down power-up entry and, therefore, the PMOS transistor P11 turns off. Because the external power supply voltage Vext is not provided to the inverters IV14 and IV15, the power-up signal PWRUP is disabled at a low level. In the deep power down power-up exit, the deep power down mode signal DPD is at a low level and therefore the PMOS transistor P11 turns on and the internal power supply voltage Vint is supplied from the external power supply voltage Vext. Because the internal power supply voltage is provided to the power-up signal generator 130, the power-up signal PWRUP is enabled at a high level by the internal power supply voltage Vint.

According to the apparatuses shown in FIGS. 3 and 4, the deep power down power-up signal DPD-PWRUP is enabled at a high level in the deep power down entry and the deep power down exit. Apparatuses shown in FIGS. 3 and 4 disable the power-up signal PWRUP at a low level in the deep power down entry and enable the power-up signal PWRUP at a high level in the deep power down exit. Therefore, the malfunction of the semiconductor chip device can be prevented in the deep power down entry.

Figure 5:
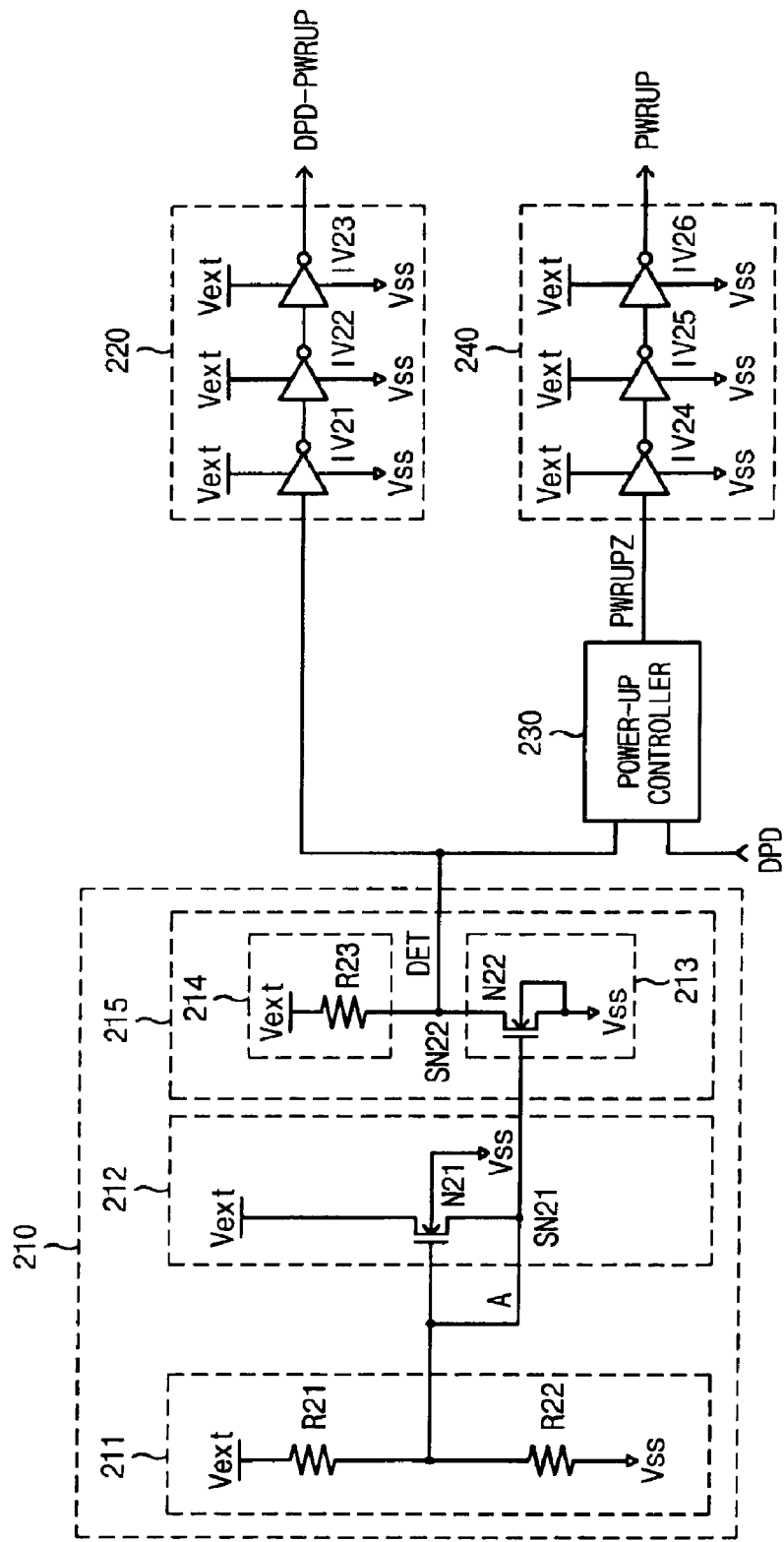
FIGS. 5 and 6 are circuit diagrams of a second type of power-up signal generators.
Figure 6:
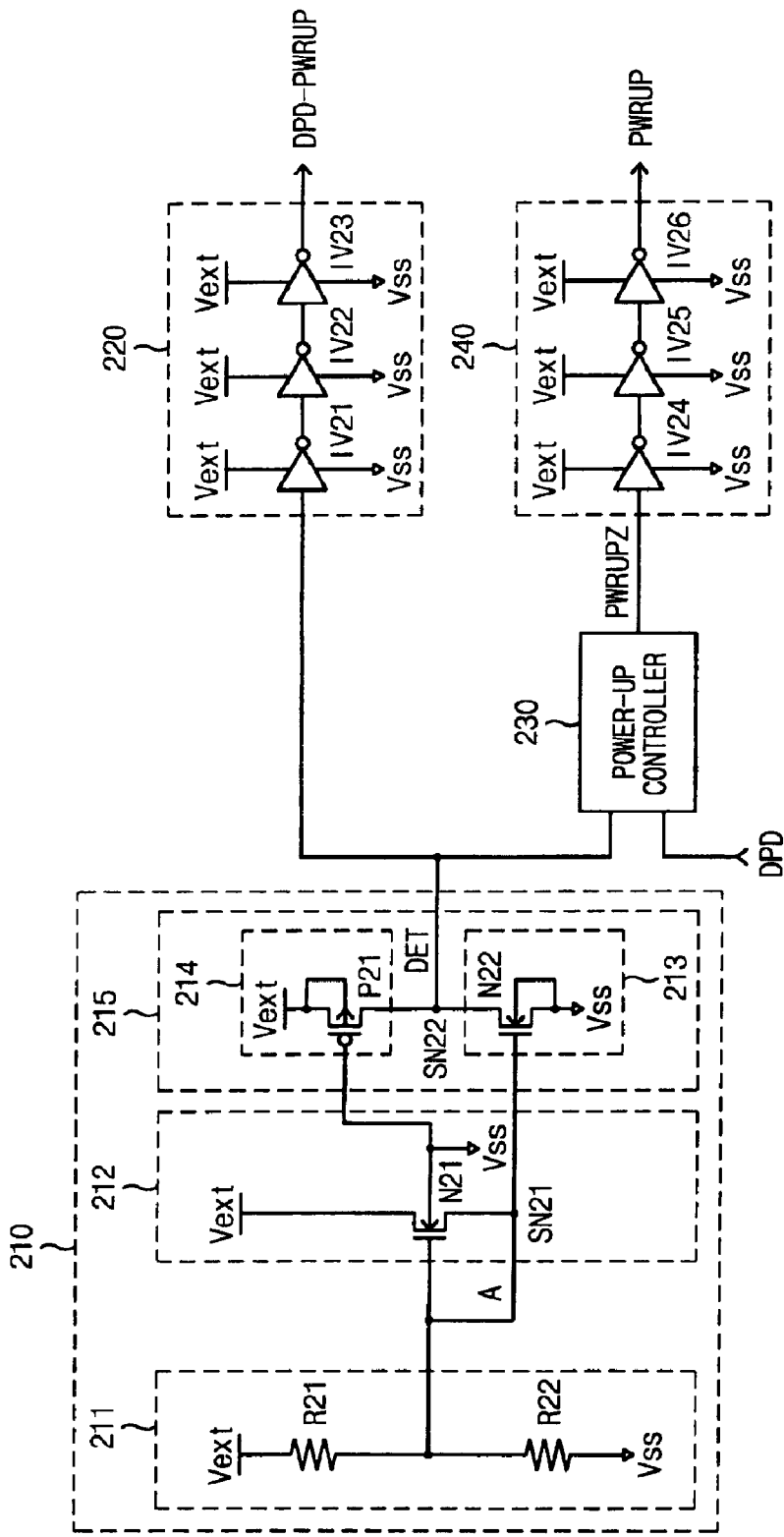

FIG. 5 and FIG. 6 are circuit diagrams of a second type of power-up signal generators. The power-up signal generators include a power-up detector 210, a deep power down power-up signal generator 220, a power-up controller 230, and a power-up signal generator 240.

The power-up detector 210 includes a voltage divider 211 for dividing an external power supply voltage Vext, a pull-up unit 212 for pulling-up a divided voltage A, and a driving unit 215 for receiving the divided voltage A to generate a power-up detection signal DET for determining an enable time of a deep power down power-up signal DPD-PWRUP and a power-up signal PWRUP. The driving unit 215 includes a pull-down unit 213 for pulling-down the power-up detection signal DET and a pull-up unit 214 for pulling-up the power-up detection signal DET.

The voltage divider 211 includes resistors R21 and R22 connected in series between the external power supply voltage Vext and a ground voltage Vss. The pull-up unit 212 includes a NMOS transistor N21 with its source and its drain connected to the external power supply voltage Vext and a node SN21, respectively. The divided voltage A is applied to the gate of the NMOS transmitter N21. The pull-down unit 213 includes a NMOS transistor N22 with its drain and its source are connected to an output node SN22 and the ground voltage Vss respectively. The divided voltage A is applied to the gate of the NMOS transistor N22. The pull-up unit 214 includes a resistor R23 connected between the external power supply voltage Vext and the output node SN22.

The power-up detector 210 outputs the power-up detection signal DET according to a current ratio of the resistor R23 and the NMOS transistor N22 and determines when the deep power down power-up signal DPD-PWRUP and the power-up signal PWRUP are enabled by the power-up detection signal DET. That is, when the current flowing through the resistor R23 (FIG. 5) or the PMOS transistor P21 (FIG. 6) is larger than the current flowing through the NMOS transistor N22, the power-up detector 210 outputs the power-up detection signal DET of a low level to enable the deep power down power-up signal DPD-PWRUP and the power-up signal PWRUP at high levels.

The deep power down power-up signal generator 220 includes inverters IV21, IV22 and IV23 connected between the external power supply voltage Vext and the ground voltage Vss. The inverters IV21–IV23 invert the power-up detection signal DET to generate the deep power down power-up signal DPD-PWRUP.

The deep power down power-up signal generator 220 generates the deep power down power-up signal DPD-PWRUP, which is always enabled in the deep power down entry and the deep power down exit.

The power-up controller 230 receives the power-up detection signal DET and the deep power down mode signal DPD and generates a power-up control signal PWRUPZ for controlling whether to enable the power-up signal PWRUP.

Figure 7A:
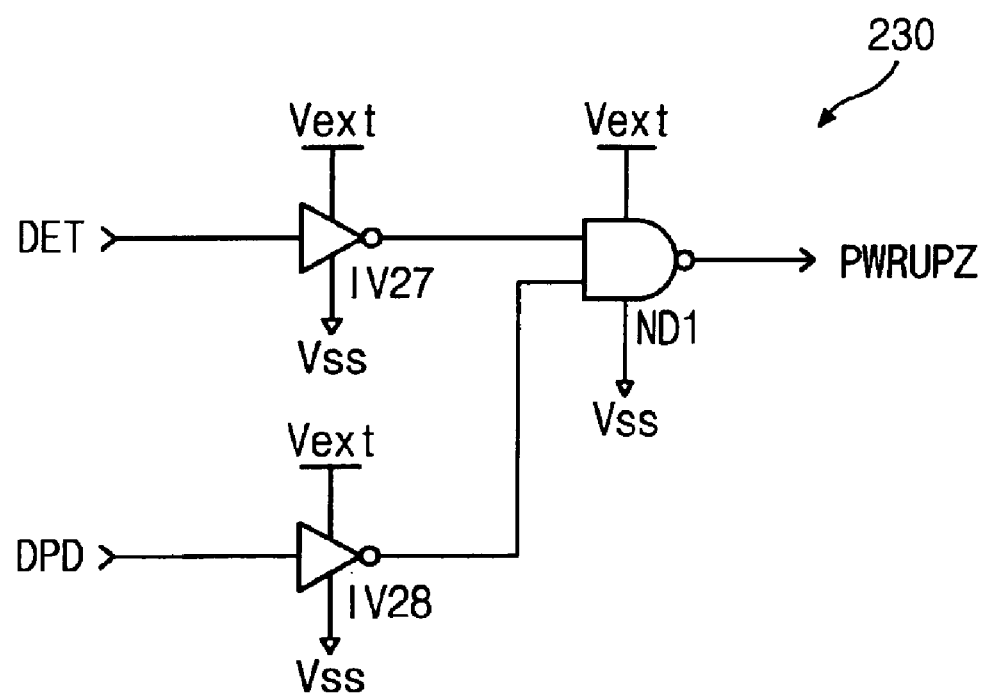
FIGS. 7A to 7C are detailed circuit diagrams of power-up controllers of FIGS. 5 and 6.
Figure 7B:
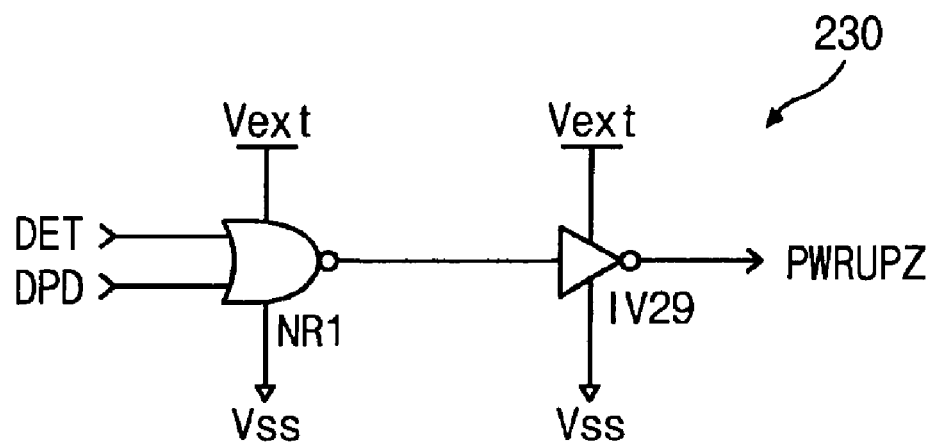
Figure 7C:
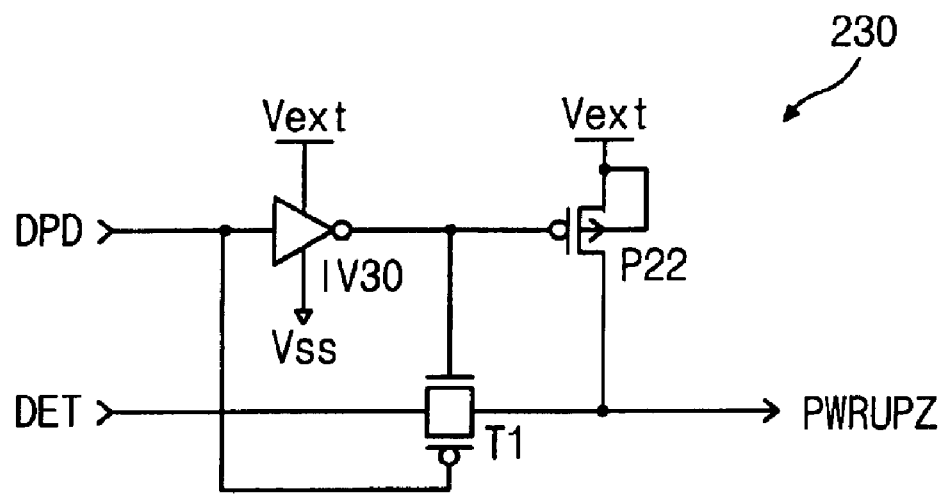

The power-up controller 230 may have the construction as shown in any of FIG. 7A through FIG. 7C.

The power-up controller 230, as shown in FIG. 7A includes an inverter IV27 connected between the external power supply voltage Vext and the ground voltage Vss. The inverter IV27 inverts the power-up detection signal DET. An inverter IV28 is also connected between the external power supply voltage Vext and the ground voltage Vss and inverts the deep power down mode signal DPD. A NAND gate ND1 is connected between the external power supply voltage Vext and the ground voltage Vss and carries out NAND logic on the output signals of the inverters IV27 and IV28 to generate the power-up control signal PWRUPZ.

The power-up controller 230, as shown in FIG. 7B, includes a NOR gate NR1, connected between the external power supply voltage Vext and the ground voltage Vss, which carries out NOR logic on the power-up detection signal DET and the deep power down mode signal DPD. An inverter IV29, which is connected between the external power supply voltage Vext and the ground voltage Vss, inverts an output signal of the NOR gate NR1 to generate the power-up control signal PWRUPZ.

The power-up controller 230, as shown in FIG. 7C, includes an inverter IV30 that is connected between the external power supply voltage Vext and the ground voltage Vss and inverts the deep power down mode signal DPD. A PMOS transistor P22 has its source and its drain connected to the external power supply voltage Vext and an output stage, respectively. An output signal of the inverter IV30 is applied to the gate of the PMOS transistor P22. A transfer gate T1 receives the power-up detection signal DET to generate the power-up control signal PWRUPZ under the control of the deep power down mode signal DPD and the output signal of the inverter IV30.

Returning to FIG. 6, the power-up signal generator 240 includes inverters IV24, IV25 and IV26, each of which is connected between the external power supply voltage Vext and the ground voltage Vss. The inverters IV24–IV26 invert the power-up control signal PWRUPZ to generate the power-up signal PWRUP. The power-up signal generator 240 generates the power-up signal PWRUP, which is disabled at a low level in the deep power down entry and is enabled at a high level in the deep power down exit.

The construction of the power-up signal generator of FIG. 6 is the substantially same as that of the power-up signal generator of FIG. 5, except that a PMOS transistor P21 is used in the power-up detector 210 instead of the resistor R23. Accordingly, a detailed description of FIG. 6 is omitted.

Hereinafter, an operation of the second type of power-up signal generators is described in brief.

The deep power down power-up signal DPD-PWRUP is always enabled at a high level in the deep power down entry and the deep power down exit. On the other hand, the power-up signal PWRUP is disabled at a low level in the deep power down entry and is enabled at a high state in the deep power down exit.

In more detail, the deep power down mode signal DPD is at a high level in the deep power down entry and therefore the power-up control signal PWRUPZ transitions to a high level and the power-up signal PWRUP becomes disabled at a low level. In the deep power down exit, the deep power down mode signal DPD is at a low level and the power-up control signal PWRUPZ transitions to a low level and the power-up signal PWRUP becomes enabled at a high level.

The second type of power-up signal generators enable the deep power down power-up signal DPD-PWRUP at a high level in the deep power down entry and the deep power down exit. According to the power-up control signal PWRUPZ, the power-up signal PWRUP is disabled at a low level in the deep power down entry power-up signal PWRUP is enabled at a high level in the deep power down exit. Therefore, the malfunction of the semiconductor chip device can be prevented in the deep power down entry.

Next, power-up signal generators of a third type are described in more detail with reference to the accompanying FIGS. 8 and 9.

Figure 8:
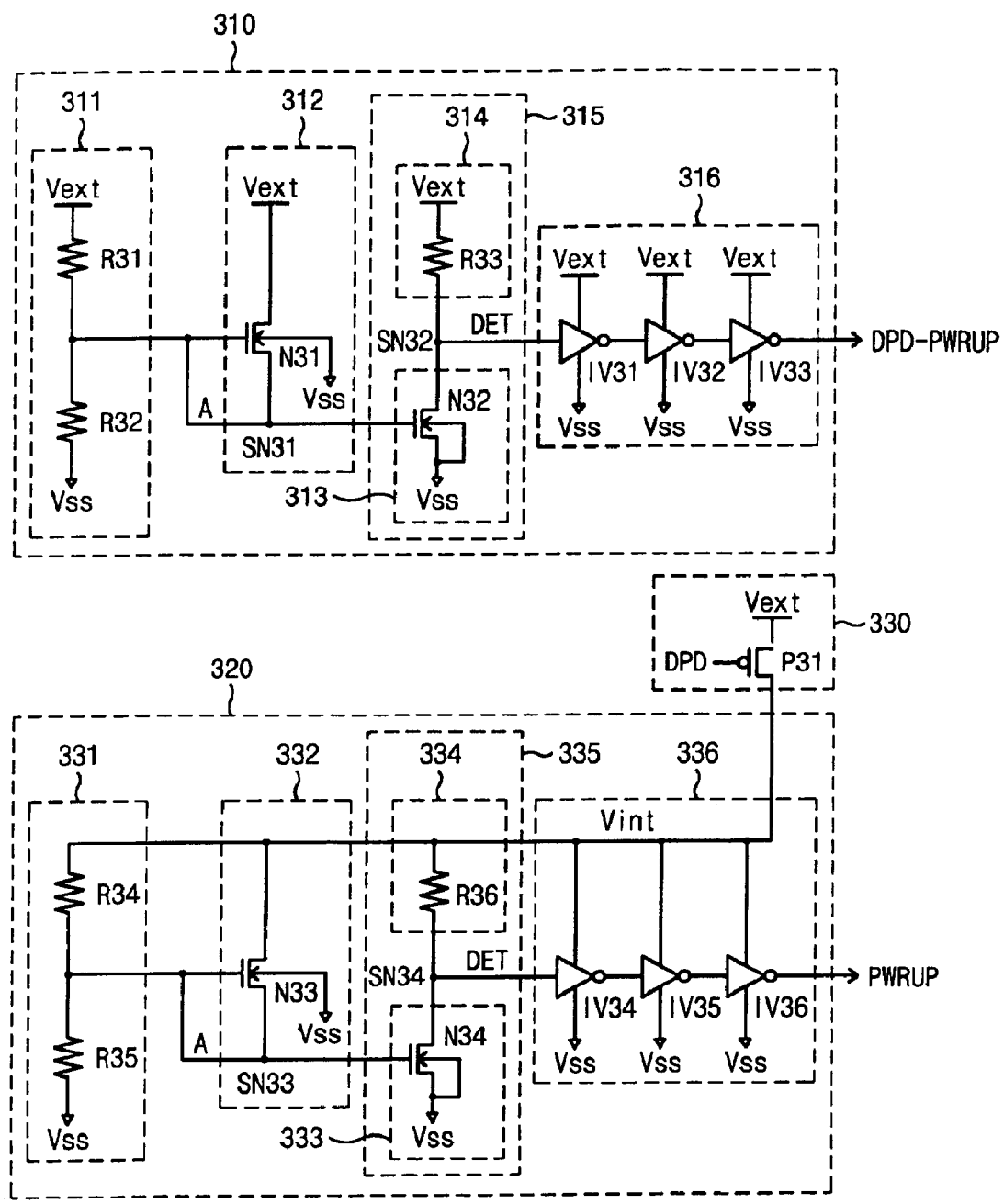
FIGS. 8 and 9 are circuit diagrams of a third type of power-up signal generators.
Figure 9:
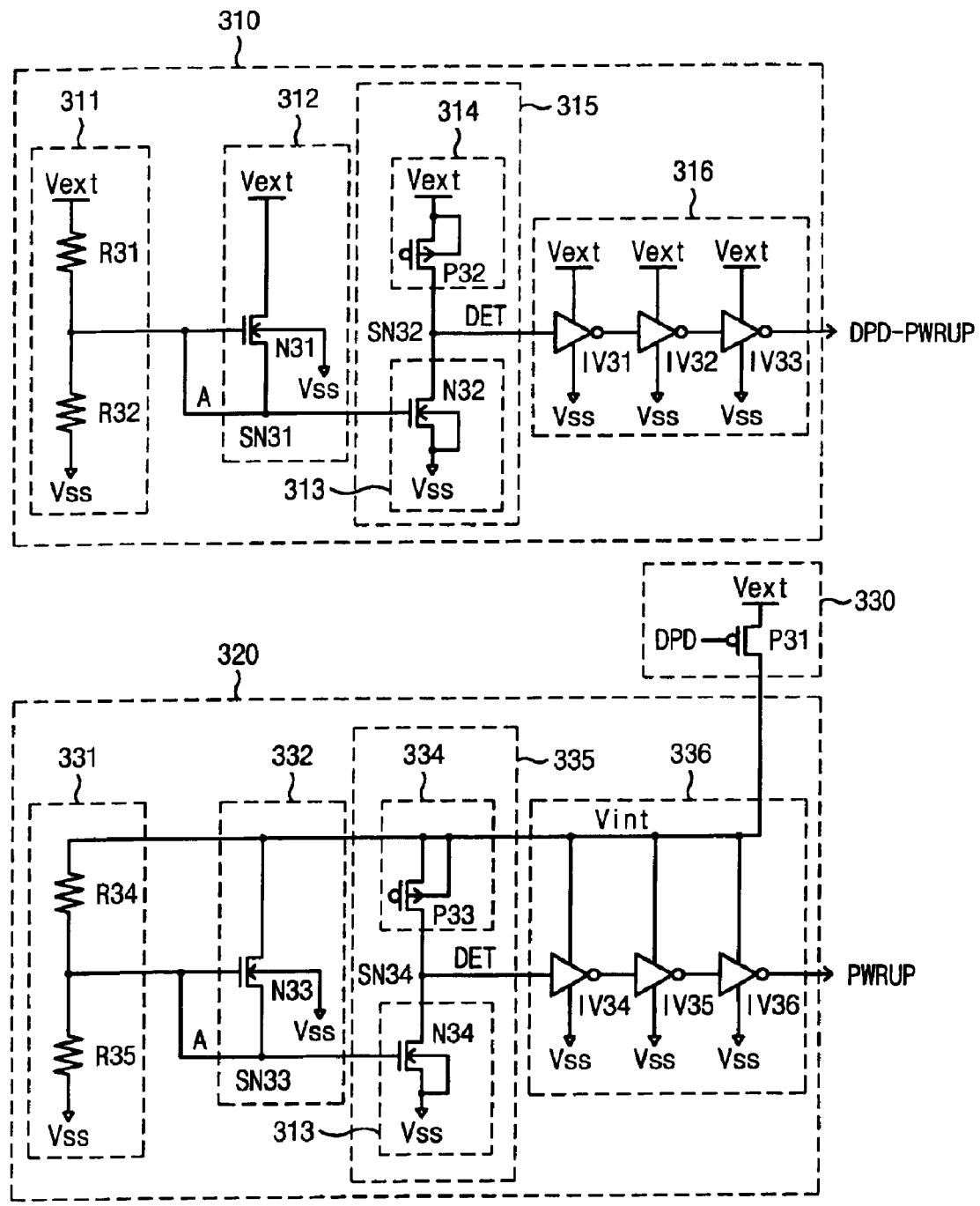

FIGS. 8 and 9 are circuit diagrams of the power-up signal generators of the third type. The power-up signal generators include a deep power down power-up signal generator 310, a power-up signal generator 320, and a power-up controller 330.

The deep power down power-up signal generator 310 includes a voltage divider 311 for dividing an external power supply voltage Vext, a pull-up unit 312 for pulling-up a divided voltage A, and a driving unit 315 for receiving the divided voltage A to generate a power-up detection signal DET and a driving unit 316 for receiving the power-up detection signal DET to generate a deep power down power-up signal DPD-PWRUP. The driving unit 315 includes a pull-up unit 314 for pulling-up the power-up detection signal DET and a pull-down unit 313 for pulling-down the power-up detection signal DET.

The voltage divider 311 includes resistors R31 and R32 connected in series between the external power supply voltage Vext and a ground voltage Vss. The pull-up unit 312 includes a NMOS transistor N31 with its source and its drain connected to the external power supply voltage Vext and a node SN31, respectively. The divided voltage A is applied to the gate of the NMOS transistor N31. The pull-down unit 313 includes a NMOS transistor N32 with its drain and its source connected to an output node SN32 and the ground voltage Vss, respectively. The divided voltage A is applied to the gate of the NMOS transistor N32. The pull-up unit 314 includes a resistor R33 connected between the external power supply voltage Vext and the output node SN32. The driving unit 316 includes inverters IV31, IV32 and IV33 connected between the external power supply voltage Vext and the ground voltage. The inverters IV31–IV33 invert the power-up detection signal DET to generate the deep power down power-up signal DPD-PWRUP.

The deep power down power-up signal generator 310 generates the deep power down power-up signal DPD-PWRUP, which is always enabled in the deep power down entry and the deep power down exit.

The power-up signal generator 320 includes a voltage divider 331 for dividing an internal power supply voltage Vint, a pull-up unit 332 for pulling-up a divided voltage A, a driving unit 335 for receiving the divided voltage A to generate a power-up detection signal DET, and a driving unit 336 for receiving the power-up detection signal DET to generate a power-up signal PWRUP. The driving unit 335 includes a pull-up unit 334 for pulling-up the power-up detection signal DET and a pull-down unit 333 for pulling-down the power-up detection signal DET.

The voltage divider 331 includes resistors R34 and R35 connected in series between the internal voltage Vint and the ground voltage Vss. The pull-up unit 332 includes a NMOS transistor N33 connected between the internal power supply voltage Vint and a node SN33. The divided voltage A is applied to the gate of NMOS transistor N33. The pull-down unit 333 includes a NMOS transistor N34 with its drain and its source connected to an output node SN34 and the ground voltage Vss respectively. The divided voltage A is applied to the gate of the NMOS transistor N34. The pull-up unit 334 includes a resistor R36 connected between the internal power supply voltage Vint and the output node SN34. The driving unit 336 includes inverters IV34, IV35 and IV36 connected between the internal power supply voltage Vint and the ground voltage Vss. The inverters IV34–IV36 invert the power-up detection signal DET to generate the power-up signal PWRUP.

The power-up signal generator 320 generates the power-up signal PWRUP, which is disabled at a low level in the deep power down entry and enabled at a high level in the deep power down exit.

The power-up controller 330 includes a PMOS transistor P31 with its source connected to the external power supply voltage. The deep power down mode signal DPD is applied to the gate of the PMOS transistor P31.

In the deep power down entry, the deep power down mode signal DPD is at a high level, and the power-up controller 330 having the above construction turns off the PMOS transistor P31 and, therefore, does not provide the external power supply voltage Vext. In the deep power down exit, the deep power down mode signal DPD is at a low level, which enables the PMOS transistor P31 and generates the internal power supply voltage Vint from the external power supply voltage Vext and provides the internal power supply voltage Vint to the power-up signal generator 320.

The construction of the power-up signal generator of FIG. 9 is substantially the same as that of the power-up signal generator of FIG. 8 except that PMOS transistors P32 and P33 are used in the deep power down power-up signal generator 310 and the power-up signal generator 320 instead of the resistors R33 and R36. Accordingly, a detailed description of FIG. 9 is omitted.

Hereinafter, operation of the third type of power-up signal generators is described in brief.

The deep power down power-up signal DPD-PWRUP is always enabled at a high level in the deep power down entry and the deep power down exit. On the other hand, the power-up signal PWRUP is disabled at a low level in the deep power down entry and is enabled at a high level in the deep power down exit.

In more detail, the deep power down mode signal DPD is at a high level in the deep power down entry and, therefore, the PMOS transistor P31 turns off. The external power supply voltage Vext is not provided and the power-up signal PWRUP becomes disabled at a low level. In the deep power down exit, the deep power down mode signal DPD is at a low level and the PMOS transistor P31 turns on. The internal power supply voltage Vint, which is made from the external power supply voltage Vext, is provided to the power-up signal generator 320 and the power-up signal PWRUP is enabled at a high level by the internal power supply voltage Vint.

The third type of power-up signal generators enable the deep power down power-up signal DPD-PWRUP at a high level in the deep power down entry as well as the deep power down exit. The third type of power-up signal generators disables the power-up signal PWRUP at a low level in the deep power down entry and enables the power-up signal PWRUP at a high level in the deep power down exit. Therefore, the malfunction of the semiconductor chip device can be prevented in the deep power down entry.

Figure 10:
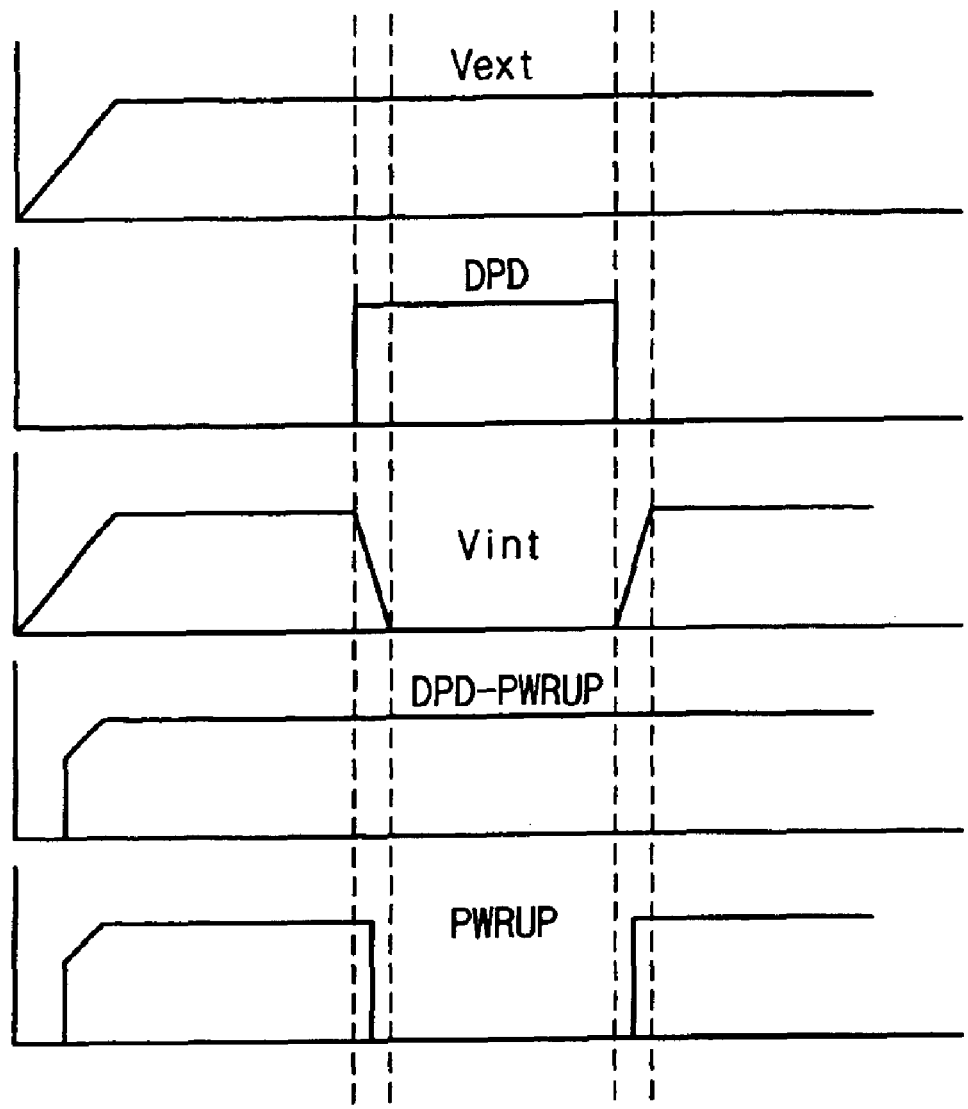
FIG. 10 is a timing diagram of the power-up signal generator.

FIG. 10 is an operation waveform of the deep power down power-up signal DPD-PWRUP and the power-up signal PWRUP according to the deep power down mode signal DPD. Referring to FIG. 10, the deep power down power-up signal DPD-PWRUP is continuously enabled at a high level. The power-up signal PWRUP is disabled at a low level in the deep power down entry and, therefore, the internal power supply voltage is not provided.

The disclosed apparatus uses a deep power down power-up signal that is always enabled for semiconductor elements that maintain at a standby mode in the deep power down entry. The disclosed apparatus also uses a power-up signal that is disabled in the deep power down entry and enabled in a deep power down exit for semiconductor elements that operate after an internal power supply voltage is generated, thereby preventing malfunction of the semiconductor elements during the deep power down entry.

The disclosed apparatus generates the deep power down power-up signal that is always enabled at a high level in the deep power down entry and the deep power down exit. The power-up signal is disabled at a low level in the deep power down entry and is enabled at a high level in the deep power down exit to drive a DRAM device. Accordingly, a malfunction of a semiconductor chip device in the deep power down entry is prevented. Therefore, the chip has stable operation, thereby improving the reliability of the chip.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A power-up signal generator for a semiconductor memory device, comprising:
    a power-up detector for generating a power-up detection signal by an external power supply voltage;
    a first power-up signal generator for generating a first power-up signal in response to the power-up detection signal;
    a second power-up signal generator for generating a second power-up signal in response to the power-up detection signal; and
    a power-up controller for determining whether or not enable the second power-up signal in a response to a deep power down mode signal;
    wherein the first power-up signal is always enabled in a deep power down entry and in a deep power down exit by the external power supply voltage; and
    wherein the power-up signal is disabled in the deer power down entry and enabled in the deep power down exit by an internal power supply voltage.

2. The power-up signal generator as claimed in claim 1, wherein the first power-up signal generator includes a plurality of inverters that are connected between the external power supply voltage and a ground voltage and even-invert an inverted signal of the power-up detection signal to generate the first power-up signal.

3. The power-up signal generator as claimed in claim 1, wherein the second power-up signal generator includes a plurality of inverters that are connected between the internal power supply voltage and a ground voltage and even-invert an inverted signal of the power-up detection signal to generate the second power-up signal.

4. The power-up signal generator as claimed in claim 1, wherein the power-up controller blocks the external power supply voltage in the deep power down entry and makes the internal power supply voltage from the external power supply voltage and provides it to the second power-up signal generator in the deep power down exit.

5. The power-up signal generator as claimed in claim 4, wherein the power-up controller includes a PMOS transistor with the external power supply voltage connected to a source thereof and the deep power down mode signal applied to a gate thereof.

6. The power-up signal generator as claimed in claim 1, wherein the first power-up signal generator includes a plurality of inverters that are connected between the external power supply voltage and a ground voltage and odd-invert the power-up detection signal to generate the first power-up signal.

7. The power-up signal generator as claimed in claim 1, wherein the power-up controller includes a NAND gate which carries out NAND logic on an inverted signal of the power-up detection signal and an inverted signal of the deep power down mode signal.

8. The power-up signal generator as claimed in claim 1, wherein the power-up controller includes;
    a NOR gate that carries out NOR logic on the power-up detection signal and the deep power down mode signal; and
    an inverter for inverting an output signal of the NOR gate.

9. The power-up signal generator as claimed in claim 1, wherein the power-up controller includes;
    a PMOS transistor with the external power supply voltage applied to a source thereof and with an inverted signal of the deep power down mode signal applied to a gate thereof; and
    a transfer gate the transmits the power-up detection signal in response to the deep power down mode signal and an inverted signal of the deep power down mode signal.

10. The power-up signal generator as claimed in claim 1, wherein the second power-up signal generator generates the second power-up signal in response to a power-up control signal outputted from the power-up controller.

11. The power-up signal generator as claimed in claim 10, wherein the second power-up signal generator includes a plurality of inverters that are connected between the external power supply voltage and a ground voltage and odd-invert the power-up control signal to generator the second power-up signal.

* * * * *

UNITED STATES PATENT AND TRADEMARK OFFICE
CERTIFICATE OF CORRECTION

PATENT NO. : 6,885,605 B2
DATED : April 26, 2005
INVENTOR(S) : Kang S. Lee et al.

It is certified that error appears in the above-identified patent and that said Letters Patent is hereby corrected as shown below:

Column 9,
Lines 20-21, after "whether or" please delete "not enable" and insert -- not to enable -- in its place.
Line 26, after "disabled in the" please delete "deer power" and insert -- deep power -- in its place.

Column 10,
Line 30, after "a transfer" please delete "gate the transmits" and insert -- gate that transmits -- in its place.
Line 41, after "control signal to" please delete "generator" and insert -- generate -- in its place.

Signed and Sealed this

Twenty-third Day of August, 2005

JON W. DUDAS
*Director of the United States Patent and Trademark Office*